US012573457B2

(12) United States Patent
Cho et al.

(10) Patent No.: US 12,573,457 B2
(45) Date of Patent: Mar. 10, 2026

(54) NON-VOLATILE MEMORY DEVICE AND OPERATING METHOD THEREOF INCLUDING A NEGATIVE DISCHARGE VOLTAGE

(71) Applicant: Samsung Electronics Co., Ltd., Suwon-si (KR)

(72) Inventors: Byungkyu Cho, Suwon-si (KR); Hyunkook Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 54 days.

(21) Appl. No.: 18/512,746

(22) Filed: Nov. 17, 2023

(65) Prior Publication Data

US 2024/0233831 A1     Jul. 11, 2024

(30) Foreign Application Priority Data

Jan. 6, 2023     (KR) ........................ 10-2023-0002502

(51) Int. Cl.
| | |
|---|---|
| *G11C 7/06* | (2006.01) |
| *G11C 16/10* | (2006.01) |
| *G11C 16/22* | (2006.01) |
| *G11C 16/04* | (2006.01) |

(52) U.S. Cl.
CPC .............. *G11C 16/22* (2013.01); *G11C 16/10* (2013.01); *G11C 16/0483* (2013.01)

(58) Field of Classification Search
CPC ..... G11C 16/22; G11C 16/10; G11C 16/0483; G11C 16/24; G11C 16/32; G11C 16/3459; G11C 16/12; G11C 16/08

USPC ...................................................... 365/189.07
See application file for complete search history.

(56) References Cited

U.S. PATENT DOCUMENTS

| | | | |
|---|---|---|---|
| 7,672,170 B2 * | 3/2010 | Lee ..................... | G11C 16/3454 |
| | | | 365/185.27 |
| 8,638,608 B2 | 1/2014 | Lai et al. | |
| 9,142,313 B2 | 9/2015 | Shim et al. | |
| 9,424,947 B2 | 8/2016 | Kwak et al. | |
| 9,508,441 B1 | 11/2016 | Nam et al. | |
| 9,595,333 B2 | 3/2017 | Sim et al. | |
| 10,832,782 B2 | 11/2020 | Park | |
| 11,615,855 B2 * | 3/2023 | Choi ...................... | G11C 16/24 |
| | | | 365/185.02 |
| 2022/0130474 A1 | 4/2022 | Choi et al. | |

* cited by examiner

*Primary Examiner* — Tha-O H Bui
(74) *Attorney, Agent, or Firm* — Harness, Dickey & Pierce, P.L.C.

(57) ABSTRACT

An operating method of a non-volatile memory device including a plurality of cell strings connected to a plurality of word lines, string select lines, and ground select lines includes applying a program voltage to a selected word line among the word lines during a program execution period, determining a discharge voltage by comparing the program voltage with a negative discharge reference voltage during the program execution period, applying a precharge voltage, which is less than the program voltage and greater than the discharge voltage, to the string select lines up to a first time point during a verify period following the program execution period, and applying the discharge voltage to a substrate of a string select transistor, which is connected to an unselected string select line among the string select lines, up to a second time point after the first time point during the verify period.

20 Claims, 15 Drawing Sheets

FIG. 10

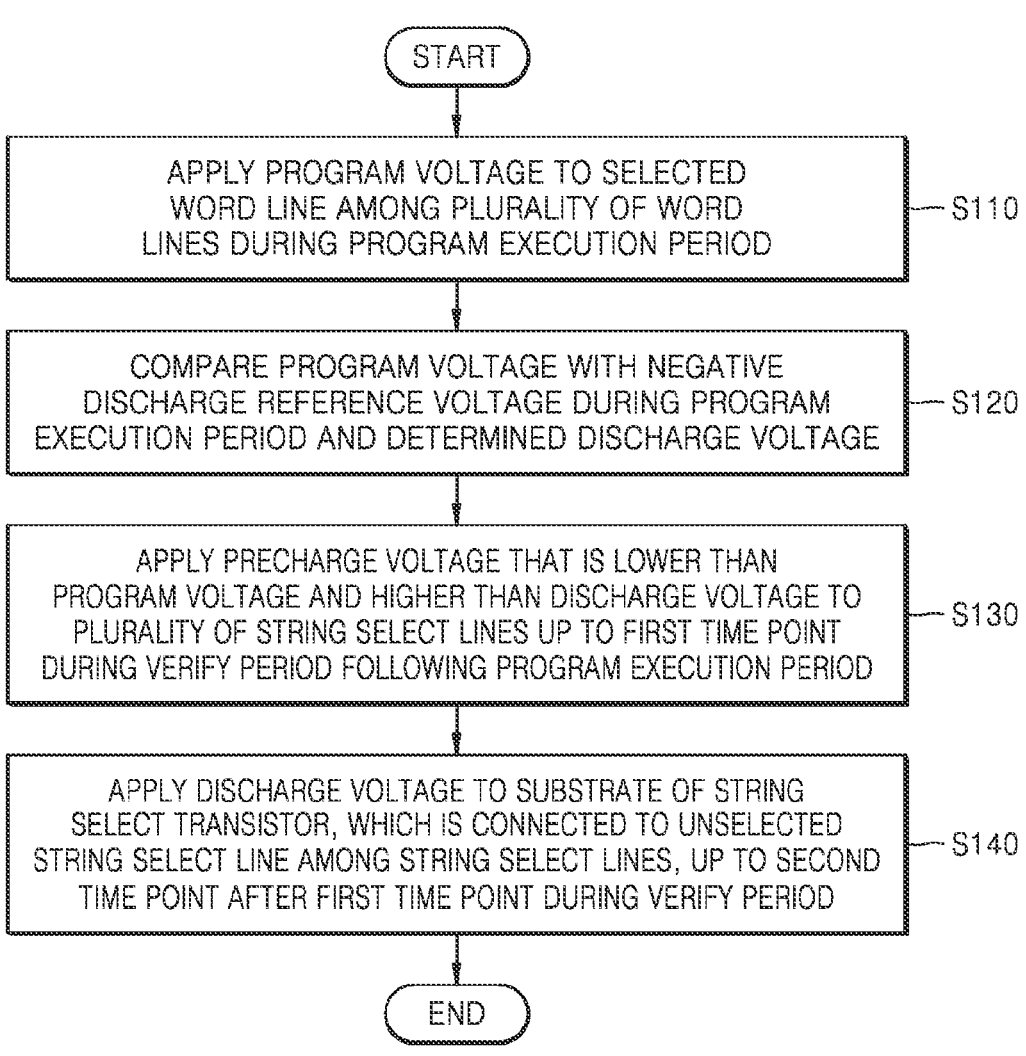

START

APPLY PROGRAM VOLTAGE TO SELECTED
WORD LINE AMONG PLURALITY OF WORD
LINES DURING PROGRAM EXECUTION PERIOD — S110

COMPARE PROGRAM VOLTAGE WITH NEGATIVE
DISCHARGE REFERENCE VOLTAGE DURING PROGRAM
EXECUTION PERIOD AND DETERMINED DISCHARGE VOLTAGE — S120

APPLY PRECHARGE VOLTAGE THAT IS LOWER THAN
PROGRAM VOLTAGE AND HIGHER THAN DISCHARGE VOLTAGE TO
PLURALITY OF STRING SELECT LINES UP TO FIRST TIME POINT
DURING VERIFY PERIOD FOLLOWING PROGRAM EXECUTION PERIOD — S130

APPLY DISCHARGE VOLTAGE TO SUBSTRATE OF STRING
SELECT TRANSISTOR, WHICH IS CONNECTED TO UNSELECTED
STRING SELECT LINE AMONG STRING SELECT LINES, UP TO SECOND
TIME POINT AFTER FIRST TIME POINT DURING VERIFY PERIOD — S140

END

NON-VOLATILE MEMORY DEVICE AND OPERATING METHOD THEREOF INCLUDING A NEGATIVE DISCHARGE VOLTAGE

CROSS-REFERENCE TO RELATED APPLICATION

This application is based on and claims priority under 35 U.S.C. § 119 to Korean Patent Application No. 10-2023-0002502, filed on Jan. 6, 2023, in the Korean Intellectual Property Office, the disclosure of which is incorporated by reference herein in its entirety.

BACKGROUND

The inventive concepts relate to non-volatile memory devices, and more particularly, to non-volatile memory devices capable of performing a negative discharge operation according to a program voltage and operating methods of the non-volatile memory devices.

In order to store data or instructions used by a host in a system and/or to perform a computational operation, systems using semiconductor chips widely use dynamic random access memory (DRAM) as the working memory or main memory thereof and also use storage devices as storage media. Storage devices include non-volatile memory. With the increase in the capacity of storage devices, the numbers of memory cells and word lines stacked on a substrate of non-volatile memory have been increased, and the number of bits of data stored in a memory cell has also been increased. To increase the storage capacity and integration density of a memory device, research into non-volatile memory devices, e.g., three-dimensional (3D) NAND flash memory devices, in which memory cells are stacked in three dimensions, has been conducted.

After a pre-pulse voltage is applied to string select lines in a program execution operation, the string select lines are discharged for a verify operation. At this time, a negative voltage may be applied to the substrate of a string select transistor connected to an unselected string select line to reduce a discharge time. However, when a negative voltage is applied, a voltage difference between the substrate and the gate of the string select transistor increases and may exceed a breakdown voltage at which the string select transistor breaks. Therefore, a method of protecting a string select transistor and reducing a discharge time is desired.

SUMMARY

The inventive concepts provide non-volatile memory devices capable of performing a negative discharge operation according to a program voltage and operating methods thereof.

According to some aspects of the inventive concepts, there is provided an operating method of a non-volatile memory device including a plurality of cell strings connected to a plurality of word lines, a plurality of string select lines, and a plurality of ground select lines. The operating method includes applying a program voltage to a selected word line among the plurality of word lines during a program execution period, determining a discharge voltage by comparing the program voltage with a negative discharge reference voltage during the program execution period, applying a precharge voltage to the plurality of string select lines up to a first time point during a verify period following the program execution period, the precharge voltage being less than the program voltage and greater than the discharge voltage, and applying the discharge voltage to a substrate of a string select transistor up to a second time point after the first time point during the verify period, the string select transistor being connected to an unselected string select line among the plurality of string select lines.

According to some aspects of the inventive concepts, there is provided a non-volatile memory device including a memory cell array including a plurality of cell strings, each including a plurality of memory cells in a vertical direction between a source line and one of a plurality of bit lines, and a control circuit configured to control a program voltage to be applied to a selected word line among a plurality of word lines during a program execution period, control a precharge voltage to be applied to a plurality of string select lines up to a first time point during a verify period following the program execution period, the precharge voltage being less than the program voltage and greater than a discharge voltage, and control the discharge voltage to be applied to a substrate of a string select transistor up to a second time point after the first time point during the verify period, the string select transistor being connected to an unselected string select line among the plurality of string select lines, wherein the control circuit includes a negative discharge manager configured to compare the program voltage with a negative discharge reference voltage during the program execution period and determine the discharge voltage.

According to some aspects of the inventive concepts, there is provided a memory system including a non-volatile memory device including a plurality of cell strings, each including a plurality of memory cells in a vertical direction between a source line and one of a plurality of bit lines, and a memory controller configured to control the non-volatile memory device, wherein the non-volatile memory device is configured to, based on control by the memory controller, apply a program voltage to a selected word line among a plurality of word lines during a program execution period, determine a discharge voltage by comparing the program voltage with a negative discharge reference voltage during the program execution period, apply a precharge voltage to a plurality of string select lines up to a first time point during a verify period following the program execution period, the precharge voltage being less than the program voltage and greater than the discharge voltage, and apply the discharge voltage to a substrate of a string select transistor up to a second time point after the first time point during the verify period, the string select transistor being connected to an unselected string select line among the plurality of string select lines.

BRIEF DESCRIPTION OF THE DRAWINGS

Example embodiments will be more clearly understood from the following detailed description taken in conjunction with the accompanying drawings in which:

FIG. 10 is a flowchart of an operating method of a non-volatile memory device, according to some example embodiments;

DETAILED DESCRIPTION OF THE EMBODIMENTS

Hereinafter, various example embodiments are described with reference to the accompanying drawings.

Figure 1:
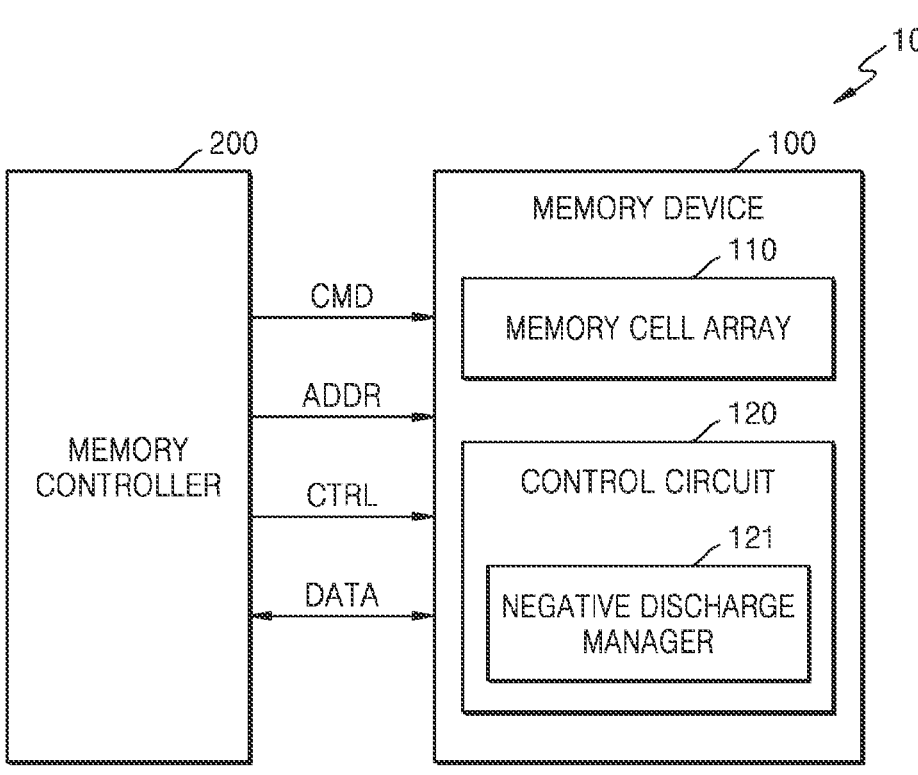
FIG. 1 is a diagram of a memory system according to some example embodiments.

FIG. 1 is a diagram of a memory system according to some example embodiments.

Referring to FIG. 1, a memory system 10 may include a memory device 100 and a memory controller 200. The memory system 10 may be included in or mounted on electronic devices, such as a personal computer (PC), a server, a data center, a smartphone, a tablet PC, an autonomous vehicle, a handheld game console, and a wearable device. For example, the memory system 10 may include a storage device, such as a solid-state drive (SSD).

The memory controller 200 may generally control operations of the memory device 100. For example, the memory controller 200 may provide a command CMD, an address ADDR, and/or a control signal CTRL to the memory device 100 to control the memory device 100. The memory device 100 may operate under control by the memory controller 200. Under control by the memory controller 200, the memory device 100 may output data stored therein or store data provided from the memory controller 200.

The memory device 100 may include a memory cell array 110 and a control circuit 120. In some example embodiments, the memory device 100 may have a cell over periphery (COP) structure. At this time, the memory cell array 110 may be located in a first semiconductor layer (e.g., first semiconductor layer L1 in FIG. 5), and the control circuit 120 may be located in a second semiconductor layer (e.g., second semiconductor layer L2 in FIG. 5). In some example embodiments, the memory device 100 may have a bonding vertical NAND (B-VNAND) structure. At this time, the memory cell array 110 may be located in a first semiconductor chip (e.g., a cell region CELL in FIG. 12), and the control circuit 120 may be located in a second semiconductor chip (e.g., a peripheral circuit region PERI in FIG. 12).

The memory cell array 110 may include a plurality of memory cells connected to word lines and bit lines. A row address in the address ADDR may indicate at least one word line, and a column address in the address ADDR may indicate at least one bit line. For example, the memory cells may include flash memory cells. However, example embodiments are not limited thereto, and the memory cells may include a resistive random access memory (RRAM) cell, a ferroelectric RAM (FRAM) cell, a phase-change RAM (PRAM) cell, a thyristor RAM (TRAM) cell, a magnetic RAM (MRAM) cell, and a dynamic RAM (DRAM) cell. Hereinafter, descriptions will be focused on embodiments in which the memory cells include NAND flash memory cells.

In some example embodiments, the memory cell array 110 may include word lines, which are stacked in a first direction (e.g., a vertical direction), and channel structures (for example, vertical channel structures, which pass through the word lines and extend in the first direction). Accordingly, the memory cell array 110 may be referred to as a "three-dimensional (3D) memory cell array". For example, when memory cells are NAND flash memory cells, the memory cell array 110 may be referred to as a "3D NAND memory cell array".

The control circuit 120 may include a negative discharge manager 121. The negative discharge manager 121 may compare a program voltage with a negative discharge reference voltage during a program execution period and determine a discharge voltage.

In some example embodiments, the negative discharge manager 121 may determine that a negative discharge reference voltage is greater than a program voltage. Based on a result of the determination, the negative discharge manager 121 may generate a comparison signal at a logic low level and store the comparison signal in a latch circuit therein. The negative discharge manager 121 may determine a discharge voltage in response to a negative discharge enable signal.

The control circuit 120 may control a discharge voltage to be applied to the substrate of a string select transistor. For example, the control circuit 120 may control a discharge voltage having a negative level to be applied to the substrate of a string select transistor, based on a discharge voltage determination signal output from the latch circuit in response to a clock signal. Here, an operation of discharging a transistor, such as a string select transistor, to a discharge voltage having a negative level may be referred to as a negative discharge operation.

In some example embodiments, the negative discharge manager 121 may determine that a program voltage is greater than the negative discharge reference voltage. Based on a result of the determination, the negative discharge manager 121 may generate a comparison signal at a logic high level and store the comparison signal in a latch circuit therein. The control circuit 120 may control a discharge voltage having a ground voltage level to be applied to the substrate of a string select transistor, based on a discharge voltage determination signal output from the latch circuit. Here, an operation of discharging a transistor, such as a string select transistor, to a discharge voltage having a ground voltage level may be referred to as a ground discharge operation.

In some example embodiments, a program voltage may include a plurality of pulse voltage levels. The negative discharge manager 121 may compare a negative discharge reference voltage with a greatest pulse voltage level among the pulse voltage levels.

The control circuit 120 may perform a verify operation by applying a verify voltage to a selected word line during a verification period after a second time point at which application of a discharge voltage ends. In some example embodiments, the memory controller 200 may control the memory device 100 to store data in response to a write request from a host. At this time, the control circuit 120 may generate various control signals for programming the data to the memory cell array 110 based on the command CMD, the address ADDR, and the control signal CTRL. In some example embodiments, the memory controller 200 may control the memory device 100 to output data in response to a read request from a host. At this time, the control circuit 120 may generate various control signals for reading the data from the memory cell array 110 based on the command CMD, the address ADDR, and the control signal CTRL.

Figure 2:
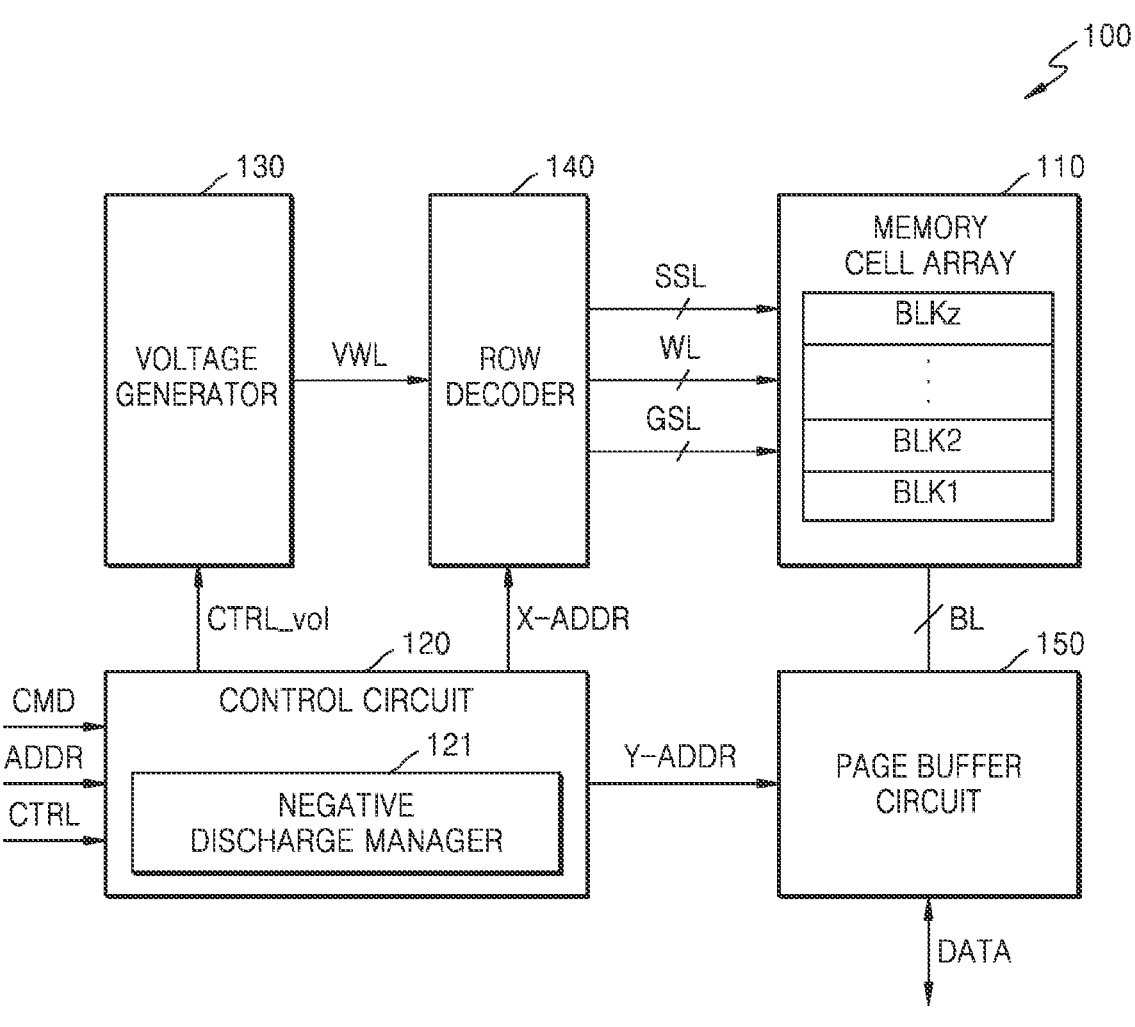
FIG. 2 is a diagram of a memory device in FIG. 1, according to some example embodiments.

FIG. 2 is a diagram of the memory device 100 in FIG. 1, according to some example embodiments.

Referring to FIG. 2, the memory device 100 may include the memory cell array 110, the control circuit 120, a voltage generator 130, a row decoder 140, and a page buffer circuit 150.

The memory cell array 110 may be connected to the row decoder 140 through a word line WL, a string select line SSL, and a ground select line GSL and connected to the page buffer circuit 150 through a bit line BL. In the memory cell array 110, a plurality of memory cells included in a plurality of memory blocks BLK1 to BLKz may include flash memory cells. The memory cell array 110 may include a 3D memory cell array. The 3D memory cell array may include a plurality of NAND strings, and each of the NAND strings may include a plurality of memory cells respectively connected to a plurality of word lines WL, which are vertically stacked.

The control circuit 120 may receive the address ADDR, the command CMD, and the control signal CTRL from the outside of the memory device 100 and exchange data with a device outside the memory device 100. The memory device 100 may further include various circuits, such as an error correction circuit, which corrects an error in data read from the memory cell array 110, and/or an input/output interface.

The control circuit 120 may generate various control signals for programming data to the memory cell array 110, reading data from the memory cell array 110, or erasing data from the memory cell array 110, based on the command CMD, the address ADDR, and the control signal CTRL. For example, the control circuit 120 may output a row address X-ADDR and a column address Y-ADDR. Accordingly, the control circuit 120 may generally control various operations of the memory device 100.

The control circuit 120 may include the negative discharge manager 121. The negative discharge manager 121 may compare a program voltage with a negative discharge reference voltage during a program execution period and determine a discharge voltage. When the negative discharge manager 121 determines that the program voltage is less than the negative discharge reference voltage, the negative discharge manager 121 may generated the comparison signal at a logic low level. In this case, the control circuit 120 may control the discharge voltage having a negative level to be applied to the substrate of a string select transistor. On the other hand, when the negative discharge manager 121 determines that the program voltage is greater than or equal to the negative discharge reference voltage, the negative discharge manager 121 may generate the comparison signal at a logic high level. In this case, the control circuit 120 may control the discharge voltage having a ground voltage level to be applied to the substrate of a string select transistor.

The voltage generator 130 may generate various kinds of voltages for performing program, read, and erase operations of the memory cell array 110, based on a voltage control signal CTRL_vol. For example, the voltage generator 130 may generate a word line voltage VWL, such as a program voltage, a read voltage, a pass voltage, an erase verify voltage, or a program verify voltage. The voltage generator

130 may further generate a string select line voltage and a ground select line voltage based on the voltage control signal CTRL_vol.

The row decoder 140 may select at least one of the memory blocks BLK1 to BLKz in response to the row address X-ADDR and select a word line WL, a string select line SSL, and a ground select line GSL of the selected memory block. The row decoder 140 may transmit a voltage for performing a memory operation to the word line WL of the selected memory block.

The page buffer circuit 150 may be connected to the memory cell array 110 through the bit line BL. In response to the column address Y-ADDR, the page buffer circuit 150 may operate as a write driver and apply a voltage corresponding to data to be stored in the memory cell array 110 to the bit line BL in a program operation and may operate as a sense amplifier and sense data stored in the memory cell array 110 in a read operation.

Figure 3:
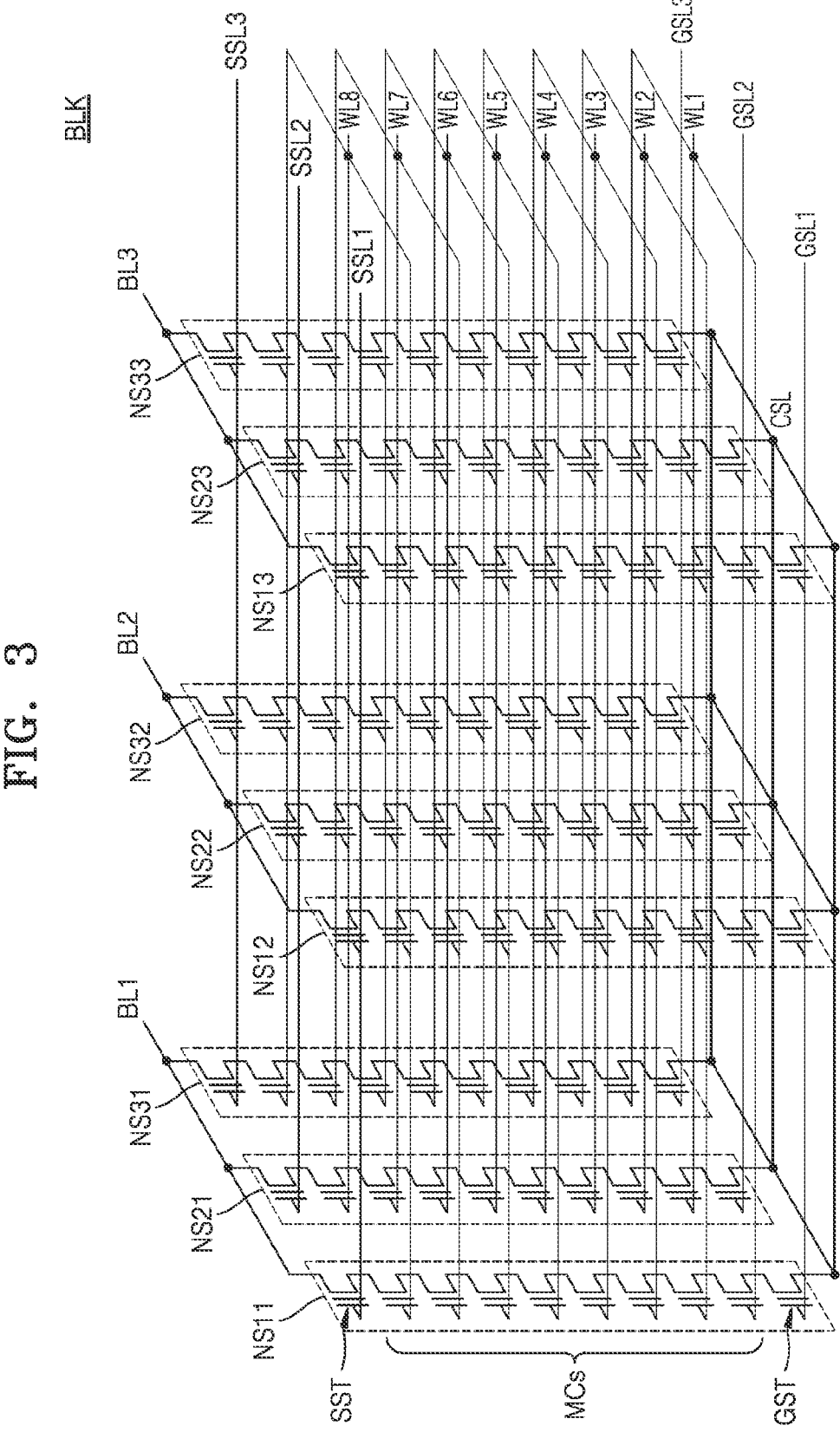
FIG. 3 is a circuit diagram of a memory block according to some example embodiments.

FIG. 3 is a circuit diagram of a memory block according to some example embodiments.

Referring to FIG. 3, a memory block BLK may correspond to one of the memory blocks BLK1 to BLKz in FIG. 2. The memory block BLK may include NAND strings NS11 through NS33. Each NAND string (for example, the NAND string NS11) may include a string select transistor SST, a plurality of memory cells MCs, and a ground select transistor GST, which are connected in series to one another. The transistors (for example, the string select transistor SST and the ground select transistor GST) and the memory cells MCs included in each NAND string may form a stack structure on a substrate in a vertical direction.

First to third bit lines BL1 to BL3 may extend in a first horizontal direction, and word lines WL1 to WL8 may extend in a second horizontal direction. The NAND strings NS11, NS21, and NS31 may be between the first bit line BL1 and a common source line CSL, the NAND strings NS12, NS22, and NS32 may be between the second bit line BL2 and the common source line CSL, and the NAND strings NS13, NS23, and NS33 may be between the third bit line BL3 and the common source line CSL. The string select transistor SST may be connected to its corresponding one among string select lines SSL1 to SSL3. Each of the memory cells MCs may be connected to its corresponding one among the word lines WL1 to WL8. The ground select transistor GST may be connected to its corresponding one among ground select lines GSL1 to GSL3. The string select transistor SST may be connected to its corresponding one among the first to third bit lines BL1 to BL3, and the ground select transistor GST may be connected to the common source line CSL. Here, the numbers of NAND strings, word lines, bit lines, ground select lines, and string select lines may vary with embodiments.

Figure 4A:
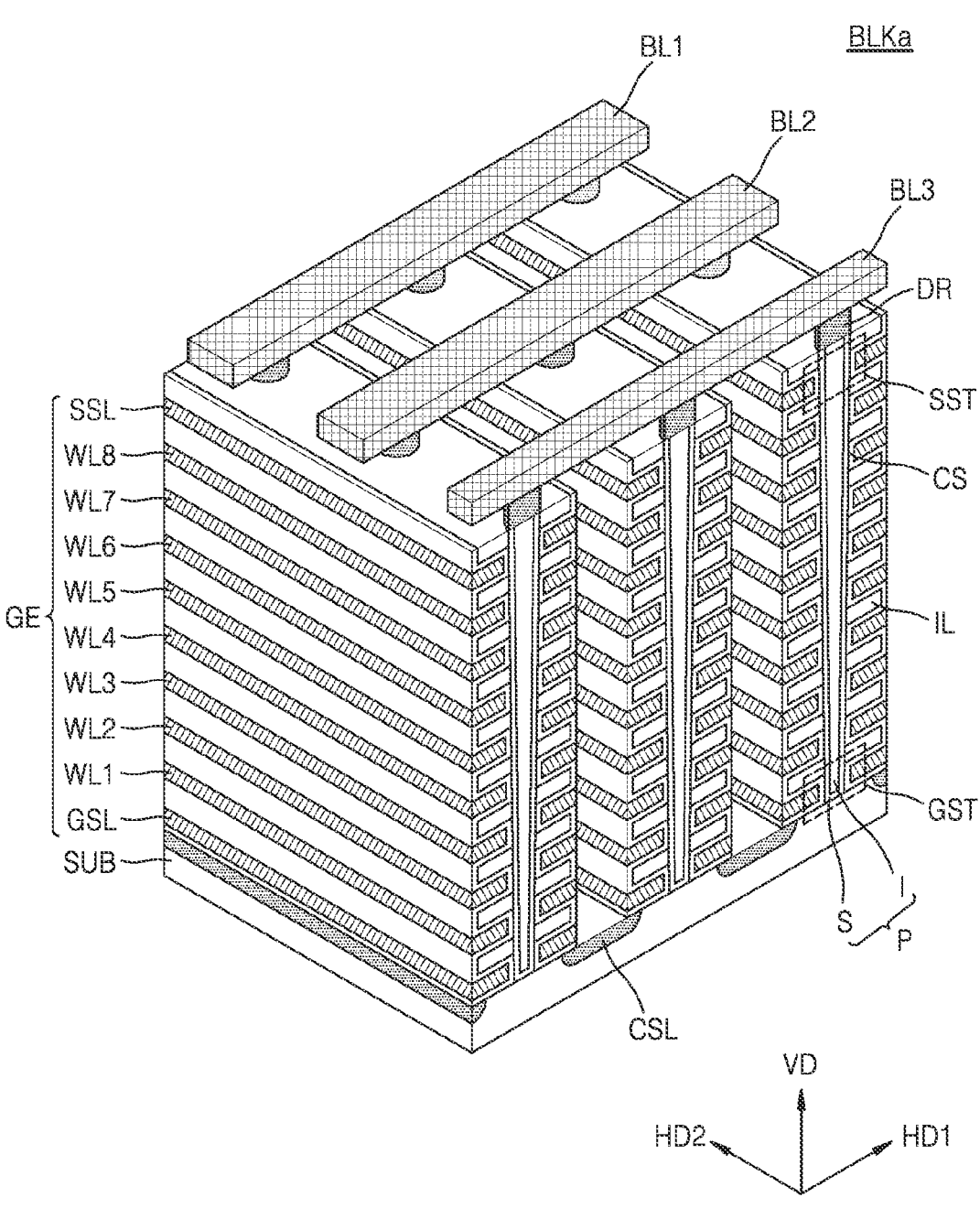
FIGS. 4A and 4B are perspective views of a memory block according to some example embodiments.
Figure 4B:
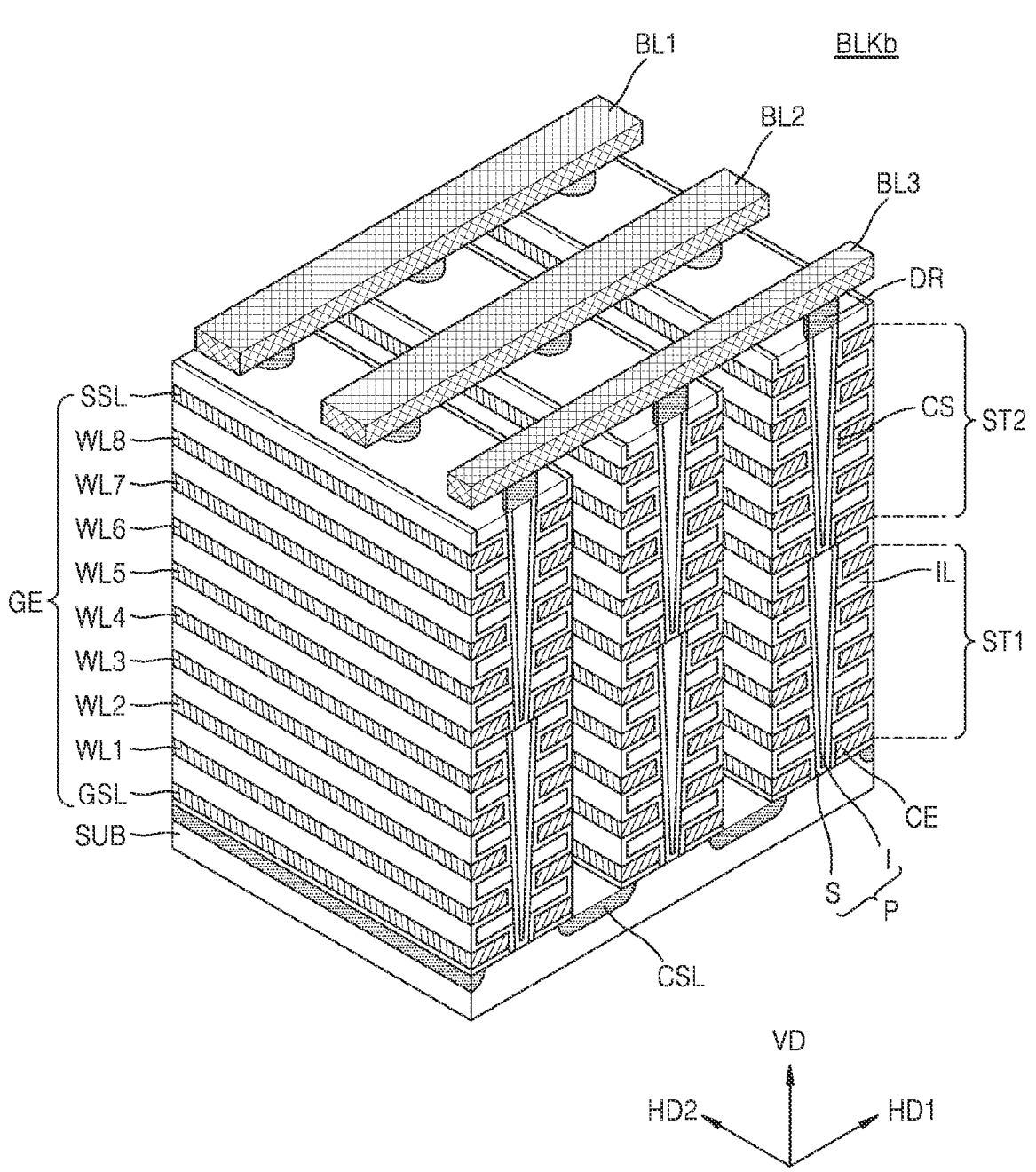

FIGS. 4A and 4B are perspective views of a memory block according to some example embodiments.

Referring to FIG. 4A, a memory block BLKa may correspond to one of the memory blocks BLK1 to BLKz in FIG. 2. The memory block BLKa is formed in a direction perpendicular to a substrate SUB. The substrate SUB has a first conductivity type (e.g., a p-type). A common source line CSL extends on the substrate SUB in a second horizontal direction HD2 and is doped with impurities of a second conductivity type (e.g., an n-type). On a region of the substrate SUB between two adjacent common source lines CSL, a plurality of insulating layers IL extend in the second horizontal direction HD2 and are sequentially provided in a vertical direction VD. The insulating layers IL are separated from each other by a certain distance in the vertical direction VD. For example, the insulating layers IL may include an insulating material such as silicon oxide.

On the region of the substrate SUB between two adjacent common source lines CSL, a plurality of pillars P pass through the insulating layers IL in the vertical direction VD. A plurality of pillars P are arranged in a first horizontal direction HD1. For example, the pillars P pass through the insulating layers IL to be in contact with the substrate SUB. For example, a surface layer S of each pillar P may include a silicone material of the first conductivity type and may function as a channel region. An inner layer I of each pillar P may include an insulating material, such as silicon oxide or an air gap.

In the region between two adjacent common source lines CSL, a charge storage layer CS is provided along the exposed surfaces of the insulating layers IL, the pillars P, and the substrate SUB. The charge storage layer CS may include a gate insulating layer (or referred to as a "tunneling insulating layer"), a charge trap layer, and a blocking insulating layer. For example, the charge storage layer CS may have an oxide-nitride-oxide (ONO) structure. In the region between two adjacent common source lines CSL, gate electrodes GE, such as a ground select line GSL, a string select line SSL, and word lines WL1 to WL8, are provided on an exposed surface of the charge storage layer CS.

In some example embodiments, the string select line SSL may include a polysilicon pattern. The string select line SSL including a polysilicon pattern may have a longer discharge time than a metal pattern. However, when a negative discharge operation is performed, a discharge time may be reduced.

Drains or drain contacts DR may be respectively provided on the pillars P. For example, the drains or drain contacts DR may include a silicone material doped with impurities of the second conductivity type. The first to third bit lines BL1 to BL3 may extend on the drains DR in the first horizontal direction HD1 and may be separated from each other by a certain distance in the second horizontal direction HD2.

Referring to FIG. 4B, a memory block BLKb may correspond to one of the memory blocks BLK1 to BLKz in FIG. 2. The memory block BLKb may correspond to a modification of the memory block BLKa of FIG. 4A, and the descriptions given above with reference to FIG. 4A may also be applied to the example embodiments of FIG. 4B. The memory block BLKb may be formed in a direction that is perpendicular to the substrate SUB. The memory block BLKb may include a first memory stack ST1 and a second memory stack ST2, which are stacked in the vertical direction VD. In some example embodiments, the first memory stack ST1 may include four word lines (for example, word lines WL1 to WL4) and the second memory stack ST2 may include four word lines (for example, word lines WL5 to WL8), however example embodiments are not limited thereto and the first and second memory stacks ST1 and ST2 may have different sizes.

Figure 5:
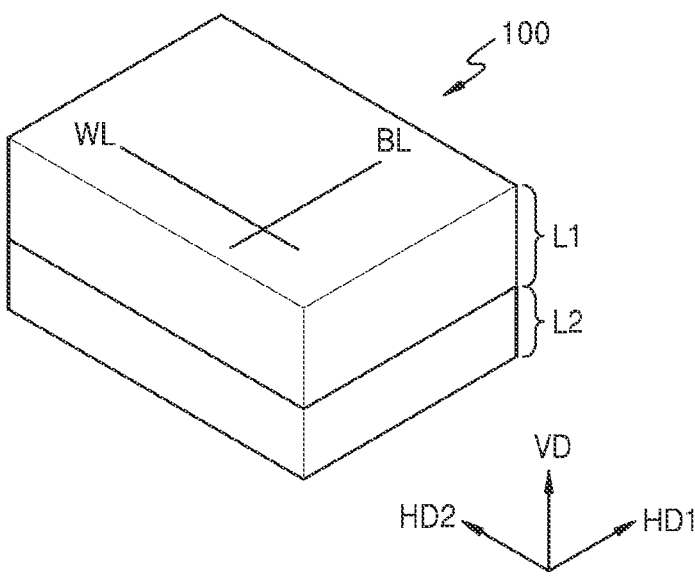
FIG. 5 is a schematic diagram illustrating the structure of the memory device of FIG. 2, according to some example embodiments.

FIG. 5 is a schematic diagram illustrating the structure of the memory device of FIG. 2, according to some example embodiments.

Referring to FIG. 5, the memory device 100 may include a first semiconductor layer L1 and a second semiconductor layer L2. The first semiconductor layer L1 may be stacked on the second semiconductor layer L2 in the vertical direction VD. For example, the second semiconductor layer L2 may be below the first semiconductor layer L1 in the vertical direction VD and thus be close to a substrate.

In some example embodiments, the memory cell array 110 in FIG. 2 may be formed in the first semiconductor layer L1. The control circuit 120, the voltage generator 130, the row decoder 140, and the page buffer circuit 150 in FIG. 2 may be formed in the second semiconductor layer L2. Accordingly, the memory device 100 may have a COP structure, in which the memory cell array 110 is above peripheral circuits. The COP structure may effectively reduce a horizontal area and may increase the integration density of the memory device 100.

In some example embodiments, the second semiconductor layer L2 may include a substrate. Peripheral circuits may be formed in the second semiconductor layer L2 by forming transistors and metal patterns, which interconnect the transistors, on the substrate. After the peripheral circuits are formed in the second semiconductor layer L2, the first semiconductor layer L1 including the memory cell array 110 may be formed. The metal patterns may be formed to electrically connect word lines WL and bit lines BL of the memory cell array 110 to the peripheral circuits in the second semiconductor layer L2. For example, the word lines WL may extend in the first horizontal direction HD1, and the bit lines BL may extend in the second horizontal direction HD2. For example, the memory block BLKa of FIG. 4A or the memory block BLKb of FIG. 4B may be formed in the first semiconductor layer L1.

Figure 6:
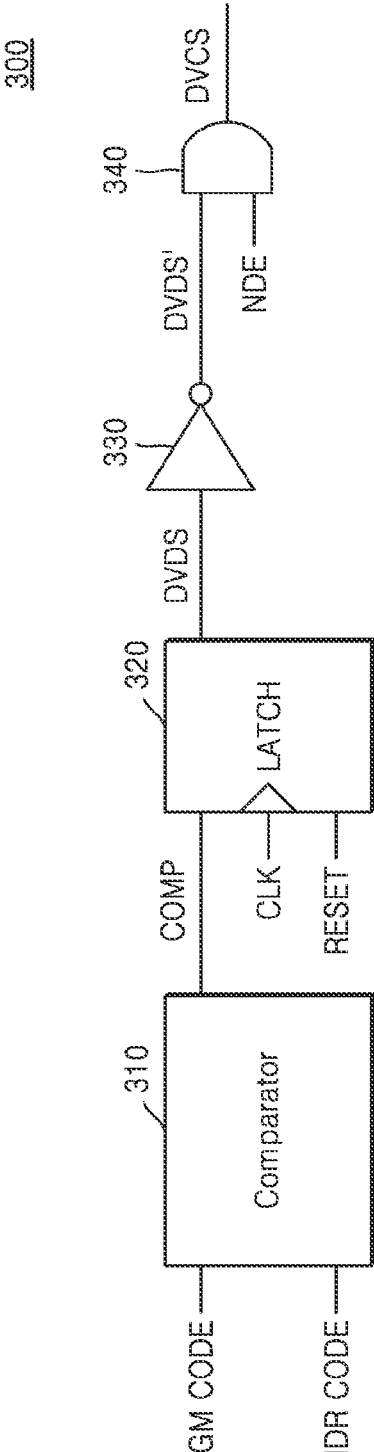
FIG. 6 is a circuit diagram of a negative discharge manager according to some example embodiments.

FIG. 6 is a circuit diagram of a negative discharge manager according to some example embodiments. FIG. 6 may be described with reference to FIGS. 1 and 2.

Referring to FIG. 6, a negative discharge manager 300 may include a comparator 310, a latch circuit 320, an inverter 330, and an AND circuit 340.

The comparator 310 may receive a program code PGM CODE and a negative discharge reference code NDR CODE from the control circuit 120. Here, the program code PGM CODE may refer to a code corresponding to a program voltage applied to a selected word line during a program execution operation. The negative discharge reference code NDR CODE may refer to a signal corresponding to a negative discharge reference voltage that is referred to by the negative discharge manager 300 to determine whether to discharge with a negative voltage.

The comparator 310 may compare a program voltage with a negative discharge reference voltage during a program execution period and output a comparison signal COMP. When determining that the negative discharge reference voltage is greater than the program voltage, the comparator 310 may output the comparison signal COMP at a logic low level. On the other hand, when determining that the program voltage is greater than the negative discharge reference voltage, the comparator 310 may output the comparison signal COMP at a logic high level.

The latch circuit 320 may store data corresponding to the comparison signal COMP. The latch circuit 320 may also output a discharge voltage determination signal DVDS corresponding to the comparison signal COMP in response to a clock signal CLK. The latch circuit 320 may receive a reset signal RESET from the control circuit 120 and initialize data stored therein in response to the reset signal RESET.

The inverter 330 may receive the discharge voltage determination signal DVDS, perform an invert operation on the discharge voltage determination signal DVDS, and output an inverted discharge voltage determination signal DVDS'.

The AND circuit 340 may receive the inverted discharge voltage determination signal DVDS' and a negative discharge enable signal NDE. The AND circuit 340 may receive the negative discharge enable signal NDE from the control circuit 120. The AND circuit 340 may perform an AND operation on the inverted discharge voltage determination signal DVDS' and the negative discharge enable signal NDE and output a discharge voltage control signal DVCS. When the negative discharge enable signal NDE or the inverted discharge voltage determination signal DVDS' is at a logic low level, the AND circuit 340 may output the discharge voltage control signal DVCS at a logic low level. On the other hand, when both the negative discharge enable signal NDE and the inverted discharge voltage determination signal DVDS' are at a logic high level, the AND circuit 340 may output the discharge voltage control signal DVCS at a logic high level.

When the control circuit 120 receives the discharge voltage control signal DVCS at a logic high level, the control circuit 120 may control a negative discharge operation. On the other hand, when the control circuit 120 receives the discharge voltage control signal DVCS at a logic low level, the control circuit 120 may control a ground discharge operation.

Figure 7:
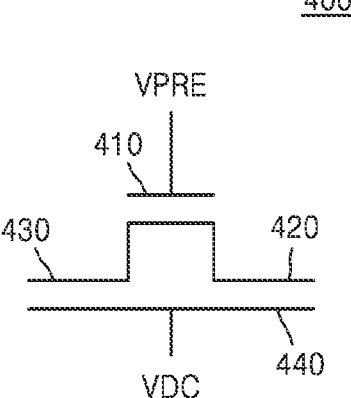
FIG. 7 is a schematic diagram of a string select transistor according to some example embodiments.

FIG. 7 is a schematic diagram of a string select transistor according to some example embodiments.

Referring to FIG. 7, a string select transistor 400 may include a gate 410, a source 420, a drain 430, and a substrate 440. During a pre-pulse operation, a pre-pulse voltage VPRE may be applied to the gate 410 of the string select transistor 400. Thereafter, a discharge voltage VDC may be applied to the substrate 440 of the string select transistor 400 to discharge the string select transistor 400. The discharge voltage VDC may be a ground voltage or a negative voltage that is less than the ground voltage.

Figure 8A:
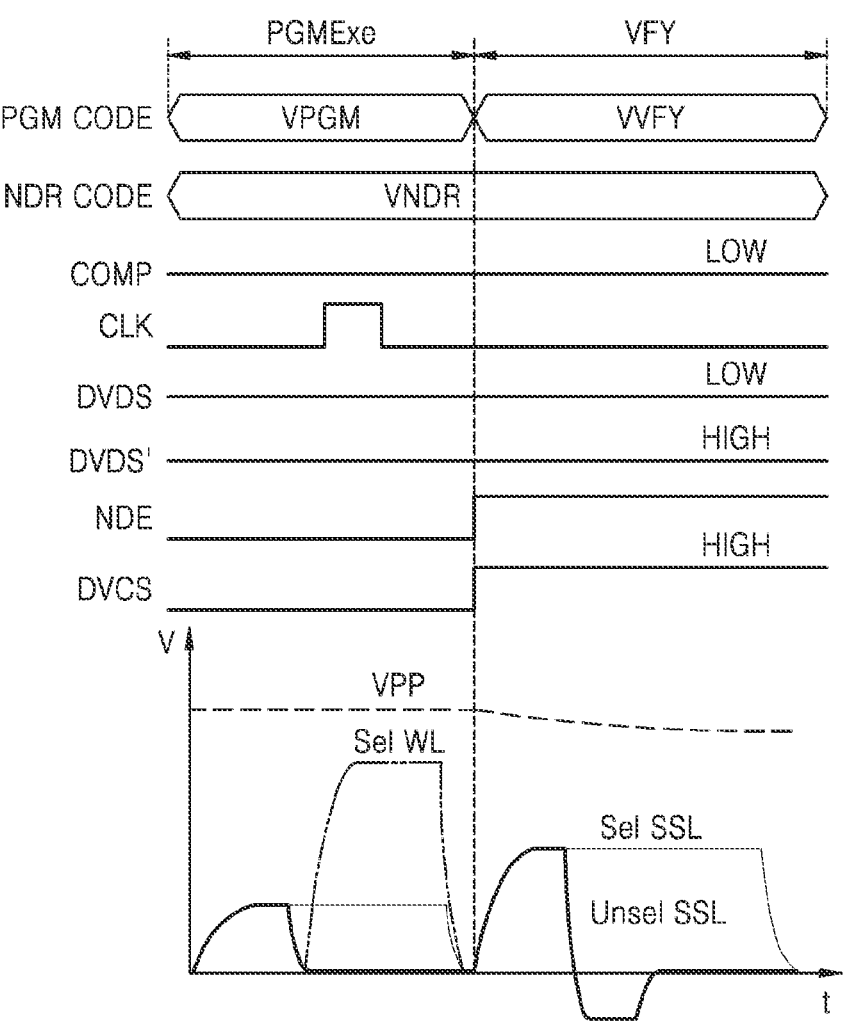
FIGS. 8A and 8B are timing diagrams of voltages applied to a negative discharge manager, according to some example embodiments.
Figure 8B:
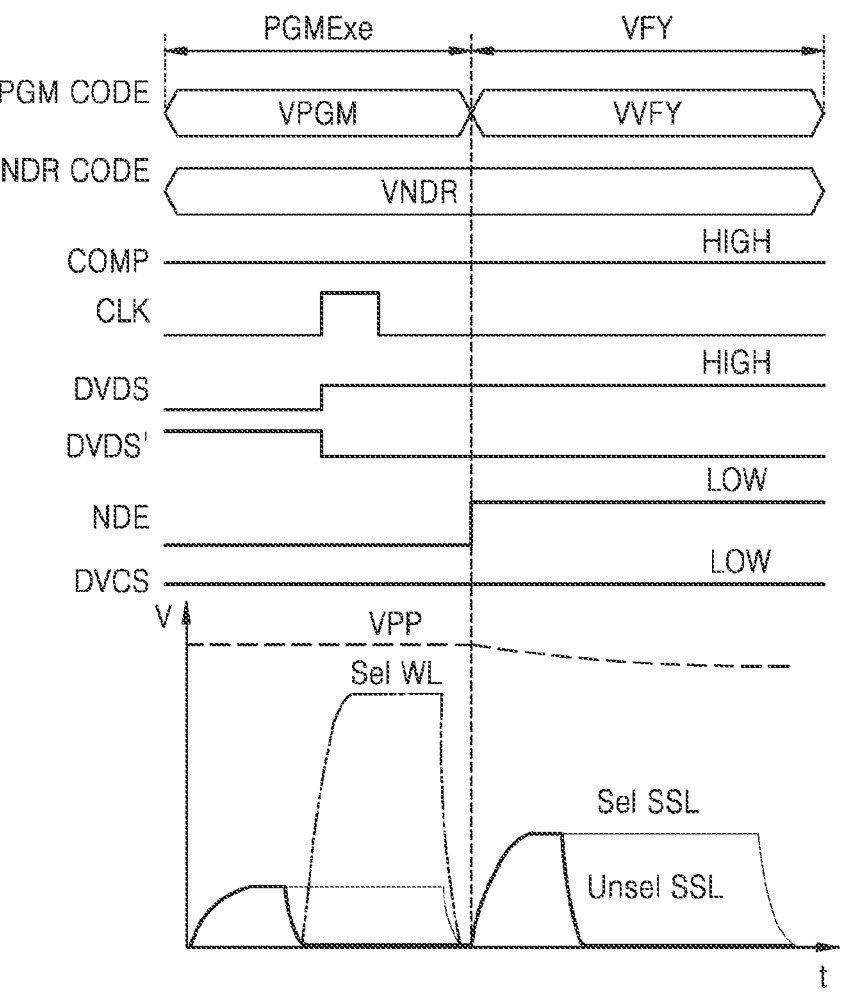

FIGS. 8A and 8B are timing diagrams of voltages applied to a negative discharge manager, according to some example embodiments. FIG. 8A illustrates a case where a negative discharge operation is performed, and FIG. 8B illustrates a case where a ground discharge operation is performed. FIGS. 8A and 8B may be described with reference to FIG. 6. FIGS. 8A and 8B may be described with reference to FIGS. 1 and 7.

FIG. 8A illustrates voltage applied to a cell string according to the timing and time of voltages applied to the negative discharge manager 121 according to some example embodiments.

During a program execution period PGMExe, the program code PGM CODE may correspond to a program voltage VPGM, and the negative discharge reference code NDR CODE may correspond to a negative discharge reference voltage VNDR. During a verification period VFY, the program code PGM CODE may correspond to a verification voltage VVFY. The negative discharge reference voltage VNDR may be based on to a breakdown voltage of a string select transistor. In FIG. 8A, the program voltage VPGM may be less than the negative discharge reference voltage VNDR.

The comparison signal COMP may be at a logic low level when the program voltage VPGM is less than the negative discharge reference voltage VNDR.

The discharge voltage determination signal DVDS may be output from the latch circuit 320 in response to the clock signal CLK. For example, the discharge voltage determination signal DVDS may be output at a rising edge of the clock signal CLK. The discharge voltage determination signal DVDS may be at a logic low level like the comparison signal COMP.

The inverted discharge voltage determination signal DVDS' may be obtained by performing an invert operation on the discharge voltage determination signal DVDS. Accordingly, the inverted discharge voltage determination signal DVDS' may be at a logic high level that is opposite to the discharge voltage determination signal DVDS.

The negative discharge enable signal NDE may be at a logic low level during the program execution period PGMExe and may be at a logic high level during a verify period VFY.

The discharge voltage control signal DVCS may be obtained by performing an AND operation on the negative discharge enable signal NDE and the inverted discharge voltage determination signal DVDS'. In other words, the discharge voltage control signal DVCS may be at a logic low level during the program execution period PGMExe and may be at a logic high level during the verify period VFY.

Among voltages applied to a cell string, a difference VPP between a gate voltage and a substrate voltage of a string select transistor, a voltage Sel WL applied to a selected word line, a voltage Sel SSL applied to a selected string select line, and a voltage Unsel SSL applied to an unselected string select line are illustrated in FIG. 8A. After the program execution period PGMExe, the control circuit 120 may discharge an unselected string select transistor by applying a negative voltage to the substrate of the unselected string select transistor according to the discharge voltage control signal DVCS.

FIG. 8B illustrates voltage applied to a cell string according to the timing and time of voltages applied to the negative discharge manager 121 according to some example embodiments.

During the program execution period PGMExe, the program code PGM CODE may correspond to the program voltage VPGM, and the negative discharge reference code NDR CODE may correspond to the negative discharge reference voltage VNDR. During the verification period VFY, the program code PGM CODE may correspond to the verification voltage VVFY. In FIG. 8B, the program voltage VPGM may be greater than the negative discharge reference voltage VNDR.

The comparison signal COMP may be at a logic high level when the program voltage VPGM is greater than the negative discharge reference voltage VNDR.

The discharge voltage determination signal DVDS may be output from the latch circuit 320 in response to the clock signal CLK. For example, the discharge voltage determination signal DVDS may be output at a rising edge of the clock signal CLK. After the rising edge of the clock signal CLK, the discharge voltage determination signal DVDS may be at a logic high level like the comparison signal COMP.

After the rising edge of the clock signal CLK, the inverted discharge voltage determination signal DVDS' may be at a logic low level that is opposite to the discharge voltage determination signal DVDS.

The negative discharge enable signal NDE may be at a logic low level during the program execution period PGMExe and may be at a logic high level during the verify period VFY.

The discharge voltage control signal DVCS may be output by performing an AND operation on the negative discharge enable signal NDE and the inverted discharge voltage determination signal DVDS'. The discharge voltage control signal DVCS may be at a logic low level during the program execution period PGMExe and the verify period VFY.

Among voltages applied to a cell string, the difference VPP between a gate voltage and a substrate voltage of a string select transistor SST, the voltage Sel WL applied to a selected word line, the voltage Sel SSL applied to a selected string select line, and the voltage Unsel SSL applied to an unselected string select line are illustrated in FIG. 8B. After the program execution period PGMExe, the control circuit 120 may discharge an unselected string select transistor by applying a ground voltage to the substrate of the unselected string select transistor according to the discharge voltage control signal DVCS.

Figure 9A:
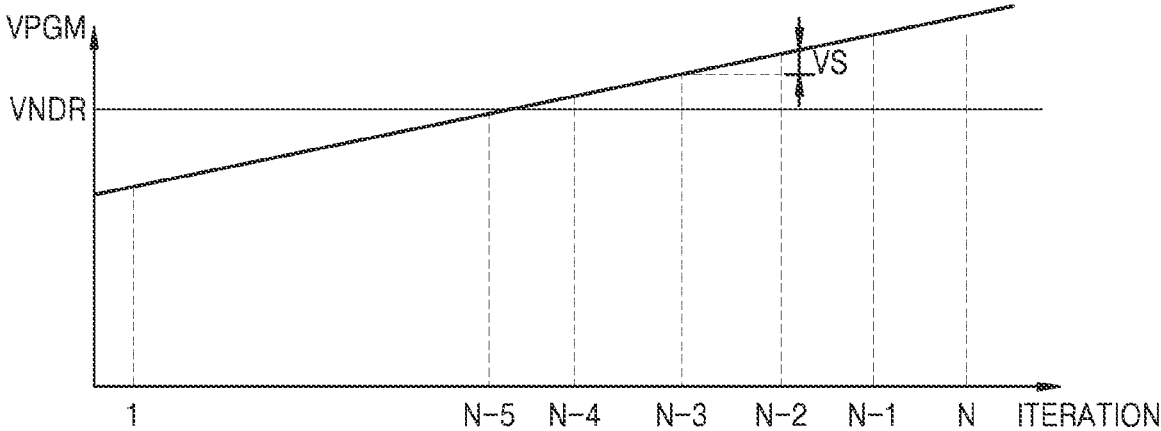
FIGS. 9A and 9B are diagrams illustrating the operation of a negative discharge manager, according to some example embodiments.
Figure 9B:
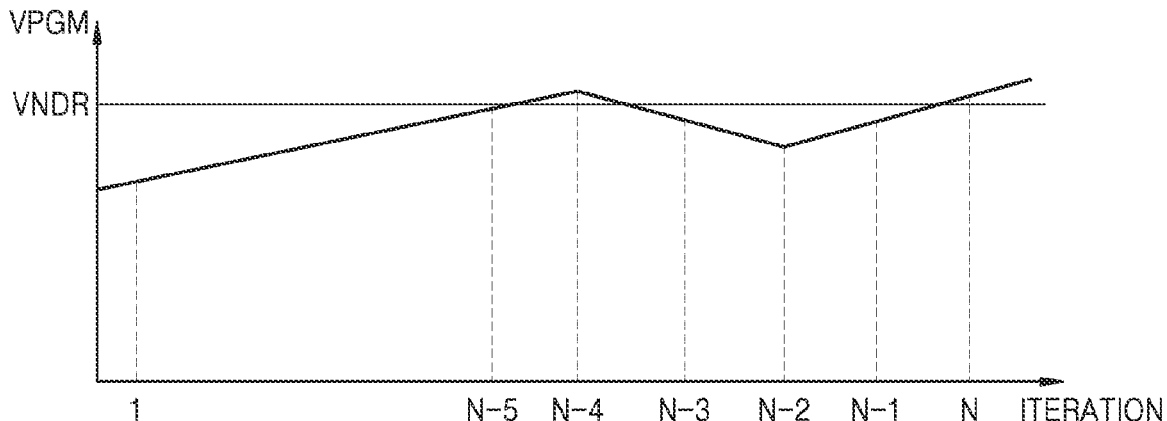

FIGS. 9A and 9B are diagrams illustrating the operation of a negative discharge manager, according to some example embodiments.

FIG. 9A illustrates a case where a program voltage constantly increases while a program loop is repeated, and FIG. 9B illustrates a case where the program voltage repeatedly increases and decreases while the program loop is repeated. FIGS. 9A and 9B may be described with reference to FIG. 1.

Referring to FIG. 9A, a program operation of a selected word line may be repeated N times while the program voltage VPGM is being changed. For example, the program operation of the selected word line may use an incremental step pulse programming (ISPP) method in which the program voltage VPGM is increased by a step voltage VS. During the first to (N−5)-th iterations of the program operation, the program voltage VPGM is less than the negative discharge reference voltage VNDR, and accordingly, the control circuit 120 may perform a negative discharge operation between program operations. On the other hand, during the (N−4)-th to N-th iterations of the program operation, the program voltage VPGM is greater than the negative discharge reference voltage VNDR, and accordingly, the control circuit 120 may perform a ground discharge operation between program operations. As such, the negative discharge operation or the ground discharge operation may be used based on the negative discharge reference voltage VNDR, which may in turn be based on to a breakdown voltage of a string select transistor. By selectively performing one of the above operations, exceeding a breakdown voltage of a string select transistor may be prevented or a chance thereof reduced.

As described above, there may be an effect of reducing a chance of a breakdown voltage being exceeded in a transistor by comparing a program voltage VPGM and a negative discharge reference voltage VNDR and selectively performing one of a negative discharge operation or a ground discharge operation.

Alternatively, or additionally, as described above, because a breakdown voltage being exceeding has been prevented or reduced, there may be an effect of maintaining transistor performance, and thus device performance, improving processing speed by avoiding performing redundant operations, improved power consumption by applying voltages within device parameters and improving operations, and the like.

Referring to FIG. 9B, a program operation of a selected word line may be repeated N times while the program voltage VPGM is being changed. During the first to (N−5)-th iterations of the program operation and the (N−3)-th to (N−1)-th iterations, the program voltage VPGM is less than the negative discharge reference voltage VNDR, and accordingly, the control circuit 120 may perform a negative discharge operation between program operations. On the other hand, during the (N−4)-th and N-th iterations of the program operation, the program voltage VPGM is greater than the negative discharge reference voltage VNDR, and accordingly, the control circuit 120 may perform a ground discharge operation between program operations. As such, the negative discharge operation or the ground discharge operation may be used based on the negative discharge reference voltage VNDR, which may in turn be based on to a breakdown voltage of a string select transistor. By selectively performing one of the above operations, exceeding a breakdown voltage of a string select transistor may be prevented or a chance thereof reduced.

As described above, there may be an effect of reducing a chance of a breakdown voltage being exceeded in a transistor by comparing a program voltage VPGM and a negative discharge reference voltage VNDR and selectively performing one of a negative discharge operation or a ground discharge operation.

Alternatively, or additionally, as described above, because a breakdown voltage being exceeding has been prevented or reduced, there may be an effect of maintaining transistor performance, and thus device performance, improving processing speed by avoiding performing redundant operations, improved power consumption by applying voltages within device parameters and improving operations, and the like.

FIG. 10 is a flowchart of an operating method of a non-volatile memory device, according to some example embodiments. FIG. 10 may be described with reference to FIGS. 1 to 3 and FIGS. 9A and 9B.

Referring to FIG. 10, the operating method of a non-volatile memory device may include operations S110 to S140.

The program voltage VPGM may be applied to a selected word line among a plurality of word lines during the program execution period PGMExe in operation S110. As shown in FIGS. 9A and 9B, the program voltage VPGM may vary while a program operation is repeatedly performed.

The program voltage VPGM may be compared with the negative discharge reference voltage VNDR during the program execution period PGMExe and a discharge voltage may be determined in operation S120. As described with reference to FIGS. 8A and 8B, when the program voltage VPGM is less than the negative discharge reference voltage VNDR, the discharge voltage may be a negative voltage that is less than a ground voltage. On the other hand, when the program voltage VPGM is greater than the negative discharge reference voltage VNDR, the discharge voltage may be the ground voltage.

A precharge voltage that is less than the program voltage VPGM and greater than the discharge voltage may be applied to a plurality of string select lines up to a first time point during the verify period VFY following the program execution period PGMExe in operation S130.

The discharge voltage may be applied to the substrate of a string select transistor, which is connected to an unselected string select line among the string select lines, up to a second time point after the first time point in operation S140.

Figure 11:
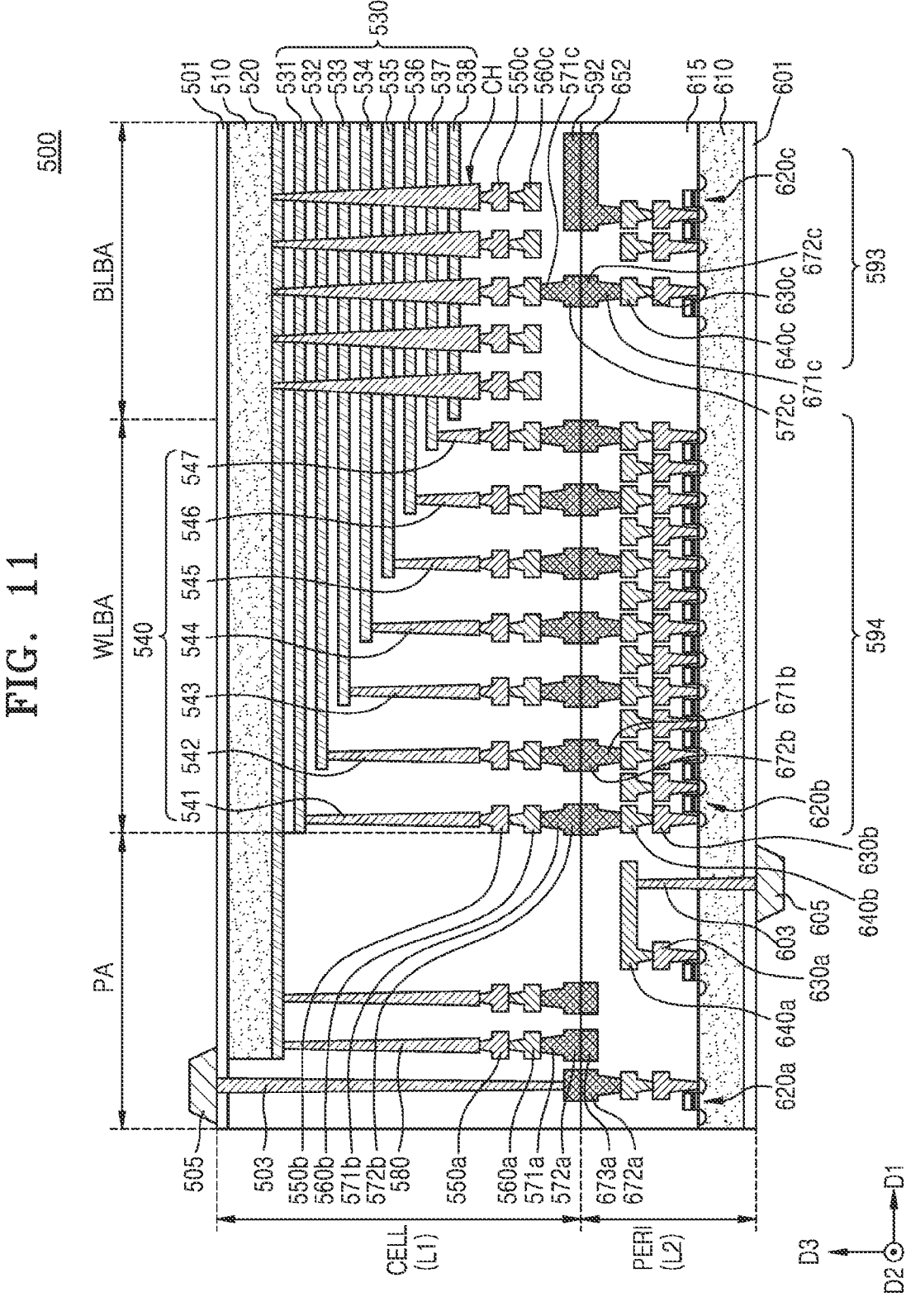
FIG. 11 is a cross-sectional view of a memory device having a bonding vertical NAND (B-VNAND) structure, according to some example embodiments.

FIG. 11 is a cross-sectional view of a memory device having a B-VNAND structure, according to some example embodiments.

For example, FIG. 11 is a cross-sectional view of a memory device 500 having a chip-to-chip (C2C) structure. Referring to FIG. 11, a cell region CELL of the memory device 500 may correspond to the first semiconductor layer L2, and a peripheral circuit region PERI of the memory device 500 may correspond to the second semiconductor layer L2. Each of the cell region CELL and the peripheral circuit region PERI of the memory device 500 may include an external pad bonding area PA, a word line bonding area WLBA, and a bit line bonding area BLBA.

The peripheral circuit region PERI may include a first substrate 610, an interlayer insulating layer 615, a plurality of circuit elements 620*a*, 620*b*, and 620*c* formed on the first substrate 610, first metal layers 630*a*, 630*b*, and 630*c* respectively connected to the plurality of circuit elements 620a, 620b, and 620c, and second metal layers 640a, 640b, and 640c formed on the first metal layers 630a, 630b, and 630c. In some example embodiments, the first metal layers 630a, 630b, and 630c may include tungsten having relatively high resistivity, and the second metal layers 640a, 640b, and 640c may include copper having relatively low resistivity.

Although only the first metal layers 630a, 630b, and 630c and the second metal layers 640a, 640b, and 640c are shown in the embodiment, the embodiment is not limited thereto, and one or more additional metal layers may be further formed on the second metal layers 640a, 640b, and 640c. At least a portion of the one or more additional metal layers formed on the second metal layers 640a, 640b, and 640c may include aluminum or the like having a lower resistivity than that of copper forming the second metal layers 640a, 640b, and 640c.

The interlayer insulating layer 615 may be disposed on the first substrate 610 and cover the plurality of circuit elements 620a, 620b, and 620c, the first metal layers 630a, 630b, and 630c, and the second metal layers 640a, 640b, and 640c. The interlayer insulating layer 615 may include an insulating material, such as silicon oxide, silicon nitride, or the like.

Lower bonding metals 671b and 672b may be formed on the second metal layer 640b in the word line bonding area WLBA. In the word line bonding area WLBA, the lower bonding metals 671b and 672b of the peripheral circuit region PERI may be electrically bonded to upper bonding metals 571b and 572b of the cell region CELL. The lower bonding metals 671b and 672b and the upper bonding metals 571b and 572b may include aluminum, copper, tungsten, or the like.

The cell region CELL may include at least one memory block. The cell region CELL may include a second substrate 510 and a common source line 520. A plurality of word lines 531 to 538 (for example, the word lines 530) may be stacked on the second substrate 510 in a direction (for example, a third direction D3) that is perpendicular to the top surface of the second substrate 510. String select lines and a GSL may be respectively arranged on and below the word lines 530, and the word lines 530 may be between the string select lines and the GSL.

In the bit line bonding area BLBA, a channel structure CH may extend in the third direction D3 that is perpendicular to the top surface of the second substrate 510 and may pass through the word lines 530, the string select lines, and the GSL. The channel structure CH may include a data storage layer, a channel layer, a buried insulating layer, and the like, and the channel layer may be electrically connected to a first metal layer 550c and a second metal layer 560c. For example, the first metal layer 550c may be referred to as a bit line contact, and the second metal layer 560c may be referred to as a bit line. In some example embodiments, the bit line 560c may extend in a second direction D2 that is parallel to the top surface of the second substrate 510.

In some example embodiments, an area in which channel structure CH, the bit line 560c, and the like are arranged may be defined as the bit line bonding area BLBA. In the bit line bonding area BLBA, the bit line 560c may be electrically connected to the circuit elements 620c providing a page buffer 593 in the peripheral circuit region PERI. For example, the bit line 560c may be connected to upper bonding metals 571c and 572c in the cell region CELL, and the upper bonding metals 571c and 572c may be connected to lower bonding metals 671c and 672c connected to the circuit elements 620c of the page buffer 593. Accordingly, the page buffer 593 may be connected to the bit line 560c through the upper and lower bonding metals 571c, 572c, 671c, and 672c.

In the word line bonding area WLBA, the word lines 530 may extend in a first direction D1 that is parallel to the top surface of the second substrate 510 and may be connected to a plurality of cell contact plugs 541 to 547 (for example, the cell contact plugs 540). The word lines 530 and the cell contact plugs 540 may be connected to each other in pads provided by at least respective portions of the word lines 530 extending in different lengths in the second direction D2. A first metal layer 550b and a second metal layer 560b may be sequentially connected to an upper portion of each of the cell contact plugs 540 connected to the word lines 530. The cell contact plugs 540 may be connected to the peripheral circuit region PERI by the upper bonding metals 571b and 572b of the cell region CELL and the lower bonding metals 671b and 672b of the peripheral circuit region PERI in the word line bonding area WLBA.

The cell contact plugs 540 may be electrically connected to the circuit elements 620b providing a row decoder 594 in the peripheral circuit region PERT. In some example embodiments, operating voltages of the circuit elements 620b providing the row decoder 594 may be different than operating voltages of the circuit elements 620c providing the page buffer 593. For example, operating voltages of the circuit elements 620c providing the page buffer 593 may be greater than operating voltages of the circuit elements 620b providing the row decoder 594.

A common source line contact plug 580 may be in the external pad bonding area PA. The common source line contact plug 580 may include a conductive material, such as a metal, a metal compound, polysilicon, or the like, and may be electrically connected to the common source line 520. A first metal layer 550a and a second metal layer 560a may be sequentially stacked on an upper portion of the common source line contact plug 580. For example, an area in which the common source line contact plug 580, the first metal layer 550a, and the second metal layer 560a are arranged may be defined as the external pad bonding area PA.

A first input-output pad 605 and a second input-output pad 505 may be arranged in the external pad bonding area PA. A lower insulating film 601 covering the bottom surface of the first substrate 610 may be formed below the first substrate 610, and the first input-output pad 605 may be formed on the lower insulating film 601. The first input-output pad 605 may be connected to at least one of the circuit elements 620a, 620b, and 620c in the peripheral circuit region PERI through a first input-output contact plug 603 and may be separated from the first substrate 610 by the lower insulating film 601. In addition, a side insulating film may be between the first input-output contact plug 603 and the first substrate 610 to electrically separate the first input-output contact plug 603 from the first substrate 610.

An upper insulating film 501 covering the top surface of the second substrate 510 may be on the second substrate 510, and the second input-output pad 505 may be on the upper insulating layer 501. The second input-output pad 505 may be connected to at least one of the circuit elements 620a, 620b, and 620c in the peripheral circuit region PERI through a second input-output contact plug 503.

According to some example embodiments, the second substrate 510 and the common source line 520 may not be arranged in an area in which the second input-output contact plug 503 is arranged. Also, the second input-output pad 505 may not overlap with the word lines 530 in the third direction D3. The second input-output contact plug 503 may be separated from the second substrate 510 in a direction that is parallel with the top surface of the second substrate 510 and may be connected to the second input-output pad 505 through an interlayer insulating layer of the cell region CELL.

According to some example embodiments, the first input-output pad 605 and the second input-output pad 505 may be selectively formed. For example, the memory device 500 may include only the first input-output pad 605 on the first substrate 610 or only the second input-output pad 505 on the second substrate 510. Alternatively, the memory device 500 may include both the first input-output pad 605 and the second input-output pad 505.

In each of the external pad bonding area PA and the bit line bonding area BLBA respectively included in the cell region CELL and the peripheral circuit region PERI, a metal pattern of a topmost metal layer may be provided as a dummy pattern, or the topmost metal layer may be absent.

In the external pad bonding area PA, the memory device 500 may include a lower metal pattern 673a, which corresponds to an upper metal pattern 572a formed in the topmost metal layer of the cell region CELL and has the same shape as the upper metal pattern 572a, in the topmost metal layer of the peripheral circuit region PERI. The lower metal pattern 673a formed in the topmost metal layer of the peripheral circuit region PERI may not be connected to a contact in the peripheral circuit region PERT. Similarly, in the external pad bonding area PA, an upper metal pattern having the same shape as a lower metal pattern formed in the topmost metal layer of the peripheral circuit region PERI may be formed in the topmost metal layer of the cell region CELL in correspondence to the lower metal pattern of the peripheral circuit region PERI.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a bonding manner.

Further, in the bit line bonding area BLBA, an upper metal pattern 592 having the same shape as a lower metal pattern 652 formed in the topmost metal layer of the peripheral circuit region PERI may be formed in the topmost metal layer of the cell region CELL in correspondence to the lower metal pattern 652. A contact may not be formed on the upper metal pattern 592 in the topmost metal layer of the cell region CELL.

In some example embodiments, the memory cell array 110 in FIG. 2 may be arranged in the cell region CELL, and peripheral circuits in FIG. 2 may be arranged in the peripheral circuit region PERI.

Figure 12:
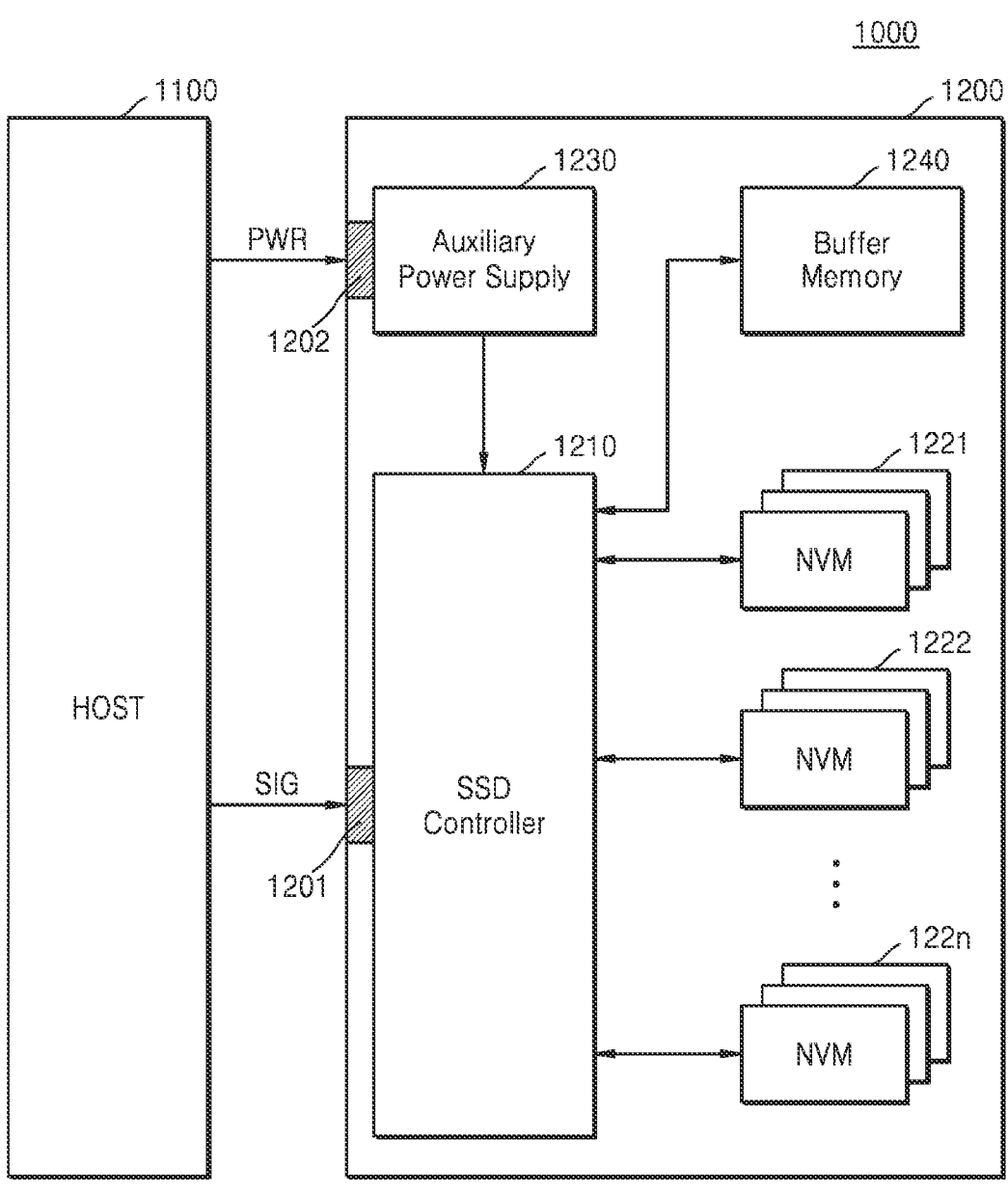
FIG. 12 is a block diagram of a solid-state drive (SSD) system using a memory device according to some example embodiments.

FIG. 12 is a block diagram of an SSD system using a memory device according to some example embodiments.

Referring to FIG. 12, an SSD system 1000 may include a host 1100 and an SSD 1200. The SSD 1200 may exchange signals SIG with the host 1100 through a signal connector 1201 and may receive power PWR through a power connector 1202. The SSD 1200 may include an SSD controller 1210, an auxiliary power supply 1230, a plurality of memory devices 1221 to 122n, and a buffer memory 1240. Each of the memory devices 1221 to 122n may include a vertical stack NAND flash memory device. At this time, the SSD 1200 may be implemented by using the embodiments described above with reference to FIGS. 1 to 11.

As described above, a non-volatile memory device may perform a negative discharge operation or a ground discharge operation according to a program voltage. For example, when the program voltage is less than a negative discharge reference voltage, the non-volatile memory device may perform the negative discharge operation. On the other hand, when the program voltage is greater than the negative discharge reference voltage, the non-volatile memory device may perform the ground discharge operation. As such, the negative discharge operation or the ground discharge operation may be selectively used. By selectively performing one of the above operations, exceeding a breakdown voltage of a string select transistor may be prevented or a chance thereof reduced.

As described above, there may be an effect of reducing a chance of a breakdown voltage being exceeded in a transistor by comparing a program voltage VPGM and a negative discharge reference voltage VNDR and selectively performing one of a negative discharge operation or a ground discharge operation.

Alternatively, or additionally, as described above, because a breakdown voltage being exceeding has been prevented or reduced, there may be an effect of maintaining transistor performance, and thus device performance, improving processing speed by avoiding performing redundant operations, improved power consumption by applying voltages within device parameters and improving operations, and the like.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

While the inventive concepts have been particularly shown and described with reference to example embodiments thereof, it will be understood that various changes in form and details may be made therein without departing from the spirit and scope of the following claims.

What is claimed is:

1. An operating method of a non-volatile memory device including a plurality of cell strings connected to a plurality of word lines, a plurality of string select lines, and a plurality of ground select lines, the operating method comprising:
    applying a program voltage to a selected word line among the plurality of word lines during a program execution period;
    determining a discharge voltage by comparing the program voltage with a negative discharge reference voltage during the program execution period;

applying a precharge voltage to the plurality of string select lines up to a first time point during a verify period following the program execution period, the precharge voltage being less than the program voltage and greater than the discharge voltage; and applying the discharge voltage to a substrate of a string select transistor up to a second time point after the first time point during the verify period, the string select transistor being connected to an unselected string select line among the plurality of string select lines.

2. The operating method of claim 1, wherein the determining of the discharge voltage includes:

determining that the negative discharge reference voltage is greater than the program voltage;

outputting a comparison signal at a logic low level based on a result of the determining that the negative discharge reference voltage is greater than the program voltage; and storing the comparison signal in a latch circuit.

3. The operating method of claim 2, wherein the applying the discharge voltage includes applying the discharge voltage having a negative level to the substrate of the string select transistor based on a discharge voltage determination signal output from the latch circuit in response to a clock signal.

4. The operating method of claim 3, wherein the applying the discharge voltage further includes applying the discharge voltage to the substrate of the string select transistor in response to a negative discharge enable signal.

5. The operating method of claim 1, wherein the determining the discharge voltage includes:

determining that the program voltage is greater than the negative discharge reference voltage;

outputting a comparison signal at a logic high level based on a result of the determining that the program voltage is greater than the negative discharge reference voltage; and storing the comparison signal in a latch circuit.

6. The operating method of claim 5, wherein the applying the discharge voltage includes applying the discharge voltage having a ground voltage level to the substrate of the string select transistor based on a discharge voltage determination signal output from the latch circuit.

7. The operating method of claim 1, wherein the program voltage includes a plurality of pulse voltage levels, and the determining the discharge voltage includes determining the discharge voltage by comparing the negative discharge reference voltage with a greatest voltage level among the plurality of pulse voltage levels.

8. The operating method of claim 1, wherein each of the plurality of string select lines includes a polysilicon pattern.

9. The operating method of claim 1, further comprising applying a verify voltage to the selected word line after the second time point during the verify period.

10. A non-volatile memory device comprising:

a memory cell array including a plurality of cell strings each including a plurality of memory cells in a vertical direction between a source line and one of a plurality of bit lines; and a control circuit configured to control a program voltage to be applied to a selected word line among a plurality of word lines during a program execution period, control a precharge voltage to be applied to a plurality of string select lines up to a first time point during a verify period following the program execution period, the precharge voltage being less than the program voltage and greater than a discharge voltage, and control the discharge voltage to be applied to a substrate of a string select transistor up to a second time point after the first time point during the verify period, the string select transistor being connected to an unselected string select line among the plurality of string select lines, the control circuit including a negative discharge manager configured to compare the program voltage with a negative discharge reference voltage during the program execution period and determine the discharge voltage.

11. The non-volatile memory device of claim 10, wherein the negative discharge manager includes:

a comparator configured to compare the program voltage with the negative discharge reference voltage and output a comparison signal; and a latch circuit configured to store the comparison signal and output a discharge voltage determination signal in response to a clock signal.

12. The non-volatile memory device of claim 11, wherein the comparator is further configured to determine that the negative discharge reference voltage is greater than the program voltage and output the comparison signal at a logic low level based on a result of the determining that the negative discharge reference voltage is greater than the program voltage, the latch circuit is further configured to output the discharge voltage determination signal corresponding to the comparison signal at the logic low level, and the control circuit is further configured to control the discharge voltage having a negative level to be applied to the substrate of the string select transistor based on the discharge voltage determination signal.

13. The non-volatile memory device of claim 12, wherein the control circuit is further configured to control the discharge voltage to be applied to the substrate of the string select transistor in response to a negative discharge enable signal.

14. The non-volatile memory device of claim 11, wherein the comparator is further configured to determine that the program voltage is greater than the negative discharge reference voltage and output the comparison signal at a logic high level based on a result of the determining that the program voltage is greater than the negative discharge reference voltage, the latch circuit is further configured to output the discharge voltage determination signal corresponding to the comparison signal at the logic high level, and the control circuit is further configured to control the discharge voltage having a ground voltage level to be applied to the substrate of the string select transistor based on the discharge voltage determination signal.

15. The non-volatile memory device of claim 11, wherein the program voltage includes a plurality of pulse voltage levels, and the negative discharge manager is further configured to compare the negative discharge reference voltage with a greatest voltage level among the plurality of pulse voltage levels and determine the discharge voltage.

16. The non-volatile memory device of claim 10, wherein each of the plurality of string select lines includes a poly-silicon pattern.

17. The non-volatile memory device of claim 10, wherein the control circuit is further configured to control a verify voltage to be applied to the selected word line after the second time point during the verify period.

18. A memory system comprising:

a non-volatile memory device including a plurality of cell strings each including a plurality of memory cells in a vertical direction between a source line and one of a plurality of bit lines; and a memory controller configured to control the non-volatile memory device, the non-volatile memory device being configured to, based on control by the memory controller, apply a program voltage to a selected word line among a plurality of word lines during a program execution period, determine a discharge voltage by comparing the program voltage with a negative discharge reference voltage during the program execution period, apply a precharge voltage to a plurality of string select lines up to a first time point during a verify period following the program execution period, the precharge voltage being less than the program voltage and greater than the discharge voltage, and apply the discharge voltage to a substrate of a string select transistor up to a second time point after the first time point during the verify period, the string select transistor being connected to an unselected string select line among the plurality of string select lines.

19. The memory system of claim 18, wherein the non-volatile memory device further includes a comparator configured to compare the program voltage with the negative discharge reference voltage and output a comparison signal; and a latch circuit configured to store the comparison signal and output a discharge voltage determination signal in response to a clock signal.

20. The memory system of claim 19, wherein the program voltage includes a plurality of pulse voltage levels, and the non-volatile memory device is further configured to compare the negative discharge reference voltage with a greatest voltage level among the plurality of pulse voltage levels and determine the discharge voltage.

*    *    *    *    *